(12) United States Patent
Yu et al.

(10) Patent No.: US 12,224,574 B2
(45) Date of Patent: Feb. 11, 2025

(54) DEVICE AND METHOD FOR COMPLIANCE TESTING OF POWER SUPPLY ADAPTERS OF INFORMATION HANDLING SYSTEMS

(71) Applicant: Dell Products L.P., Round Rock, TX (US)

(72) Inventors: Wei Cheng Yu, New Taipei (TW); Merle Jackson Wood, III, Round Rock, TX (US); Geroncio Ong Tan, Austin, TX (US); Chi Che Wu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 775 days.

(21) Appl. No.: 17/510,445

(22) Filed: Oct. 26, 2021

(65) Prior Publication Data

US 2023/0128943 A1      Apr. 27, 2023

(51) Int. Cl.
*H02H 3/20*         (2006.01)
*G01R 31/40*        (2020.01)
*H02H 1/00*         (2006.01)

(52) U.S. Cl.
CPC .............. *H02H 3/20* (2013.01); *G01R 31/40* (2013.01); *H02H 1/0007* (2013.01)

(58) Field of Classification Search
CPC .......... H02H 3/20; H02H 1/0007; G01R 31/40
See application file for complete search history.

(56) References Cited

U.S. PATENT DOCUMENTS

| 9,906,143 B1* | 2/2018 | Yu ...................... H02M 3/33592 |
| 2011/0096578 A1* | 4/2011 | Fang ...................... H03K 5/08 |
| | | 363/127 |

\* cited by examiner

*Primary Examiner* — Adolf D Berhane
*Assistant Examiner* — Afework S Demisse
(74) *Attorney, Agent, or Firm* — Terrile, Cannatti & Chambers, LLP; Emmanuel A. Rivera

(57) ABSTRACT

Described are computer implemented methods, a system and a power supply amplifier (PSA) that supports compliance testing of the PSA. The power supplies power to a powered device/information handling system. A voltage of synchronous rectifier (SR) gate is measured and compared to a calculated sense voltage at a sense resistor of the PSA. If the sense voltage is zero, received current of the PSA bypasses a first blocking MOSFET and a second blocking MOSFET for over voltage protection. If the sense voltage is not zero, the received current passes through the first blocking MOSFET.

20 Claims, 6 Drawing Sheets

DEVICE AND METHOD FOR COMPLIANCE TESTING OF POWER SUPPLY ADAPTERS OF INFORMATION HANDLING SYSTEMS

BACKGROUND OF THE INVENTION

Field of the Invention

The present invention relates to information handling systems. More specifically, embodiments of the invention provide for compliance testing of power supply adapters for information handling systems.

Description of the Related Art

As the value and use of information continues to increase, individuals and businesses seek additional ways to process and store information. One option available to users is information handling systems. Information handling systems include personal computers (PC), server computers, desktop computers, notebooks, laptops, etc. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems, such a notebooks and laptops, implement the use of external power supply adapters (PSA), that are connected to alternating current (AC) sources and provide direct current (DC) to the information handling system. Industry standards, such as LPS (limited power supply)/IEC62368-3 provide standards for compliance testing of PSAs. In particular, such standards apply for equipment that supplies and receives power through communication cables or ports. Requirements are addressed as to circuits designed to transfer DC from power sourcing equipment, such as a PSA, to a powered device (PD), such as an information handling system. Power transfers can occur for various voltages, such as industry classification levels of ES1, ES2 and ES3. A cable can supply the power from the PSA to the PD, even though the cable is used for communication. For example, the cable may be a USB type C communication cable.

For example, certain existing PSA configurations, such as variable power 90 W/130 W USB type C PSA designs, may not be able to comply with the IEC 62368-3 single fault requirement where a current sense resistor is shorted during adapter overload test. The overload test requires a PSA not to exceed 130% of a negotiated PD output, when a current sense resistor is shorted. Furthermore, these PSA configurations may use a fuse to comply with safety LPS 100VA requirement when the current sense resistor is shorted. The fuse may be a constraint as to adapter peak power capability and as a result cannot support particular instances when the PSA is required to provide large dynamic power/current to the PD.

SUMMARY OF THE INVENTION

A computer-implementable method for compliance testing of a power supply adapter (PSA) to a powered device (PD) and system comprising measuring a voltage at synchronous rectifier (SR) gate of the PSA, where the SR gate receives current from a main converter of the PSA; measuring a sense current at a sense resistor wherein the sense current follows from the SR gate; calculating a sense voltage based on the measured sense current and value of sense resistor; if sense voltage is zero, bypassing received current of the PSA at a first blocking MOSFET, and using a second blocking MOSFET for over voltage protection and passing the received current to an output of the PSA; and if the sense voltage is not zero, passing the received current through the first blocking MOSFET.

A power supply adapter (PSA) configured to supply power to a powered device (PD) comprising a synchronous rectifier (SR) gate of the PSA, where the SR gate receives current from a main converter of the PSA, wherein voltage of the SR gate is measured; a sense resistor receiving sense current at a sense resistor which follows from the SR gate, wherein a sense voltage is calculated based measure sense current and value of the sense resistor; a first blocking MOSFET, wherein if sense voltage is zero, by passing received current of the PSA at the first blocking MOSFET; and a second blocking MOSFET for over voltage protection when the first blocking MOSFET is bypassed, and if the sense voltage is not zero, passing the received current through the first blocking MOSFET.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Various implementations provide for monitoring synchronous rectifier (SR) voltage of an SR gate from a main converter of a power supply amplifier (PSA) and comparing the voltage of the SR gate to a sense voltage at a sense resistor that follows the SR gate. If the sense voltage is determined to be zero, a short condition exists at the sense resistor, and a first blocking MOSFET is bypassed with input current to the PSA. A second blocking MOSFET is used for over voltage protection.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, gaming, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a microphone, keyboard, a video display, a mouse, etc. The information handling system may also include one or more buses operable to transmit communications between the various hardware components.

Figure 1:
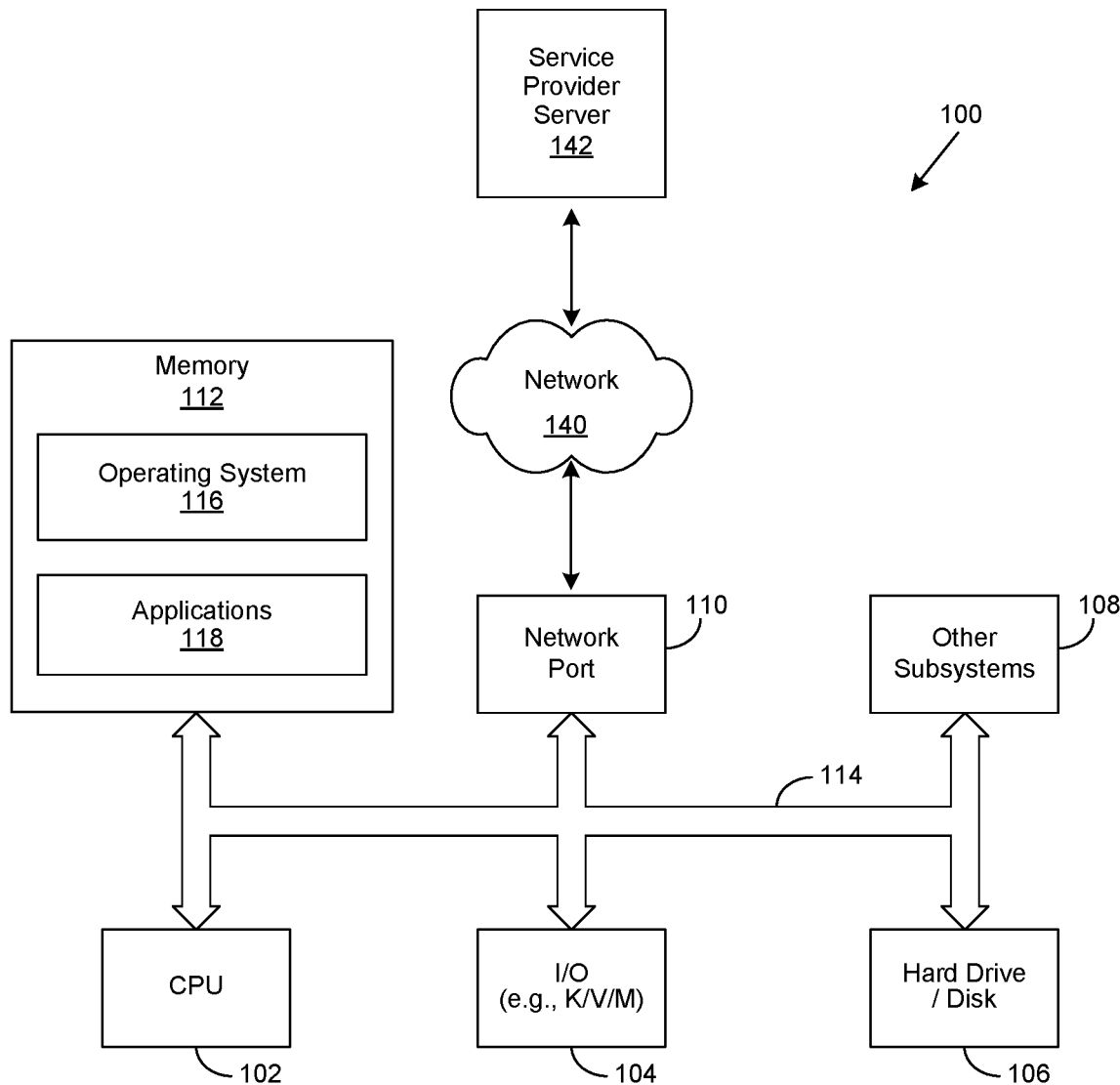
FIG. 1 is a general illustration of components of an information handling system as implemented in the present invention.

FIG. 1 is a generalized illustration of an information handling system 100. The information handling system 100 can be considered as a powered device (PD) connected to and provided power from the power supply adapters (PSA) described herein.

The information handling system 100 includes a processor (e.g., central processor unit or "CPU") 102, input/output (I/O) devices 104, such as a microphone, a keyboard, a video/display, a mouse, and associated controllers (e.g., K/V/M), a hard drive or disk storage 106, and various other subsystems 108. Various implementations provide for the I/O devices 104 to include a power supply adapter (PSA) as described herein. Implementations provide for such a PSA to be attached using a communication cable, such as a USB Type C.

In various embodiments, the information handling system 100 also includes network port 110 operable to connect to a network 140, where network 140 can include one or more wired and wireless networks, including the Internet. Network 140 is likewise accessible by a service provider server 142. The information handling system 100 likewise includes system memory 112, which is interconnected to the foregoing via one or more buses 114. System memory 112 can be implemented as hardware, firmware, software, or a combination of such. System memory 112 further includes an operating system (OS) 116. Embodiments provide for the system memory 112 to include applications 118.

Figure 2:
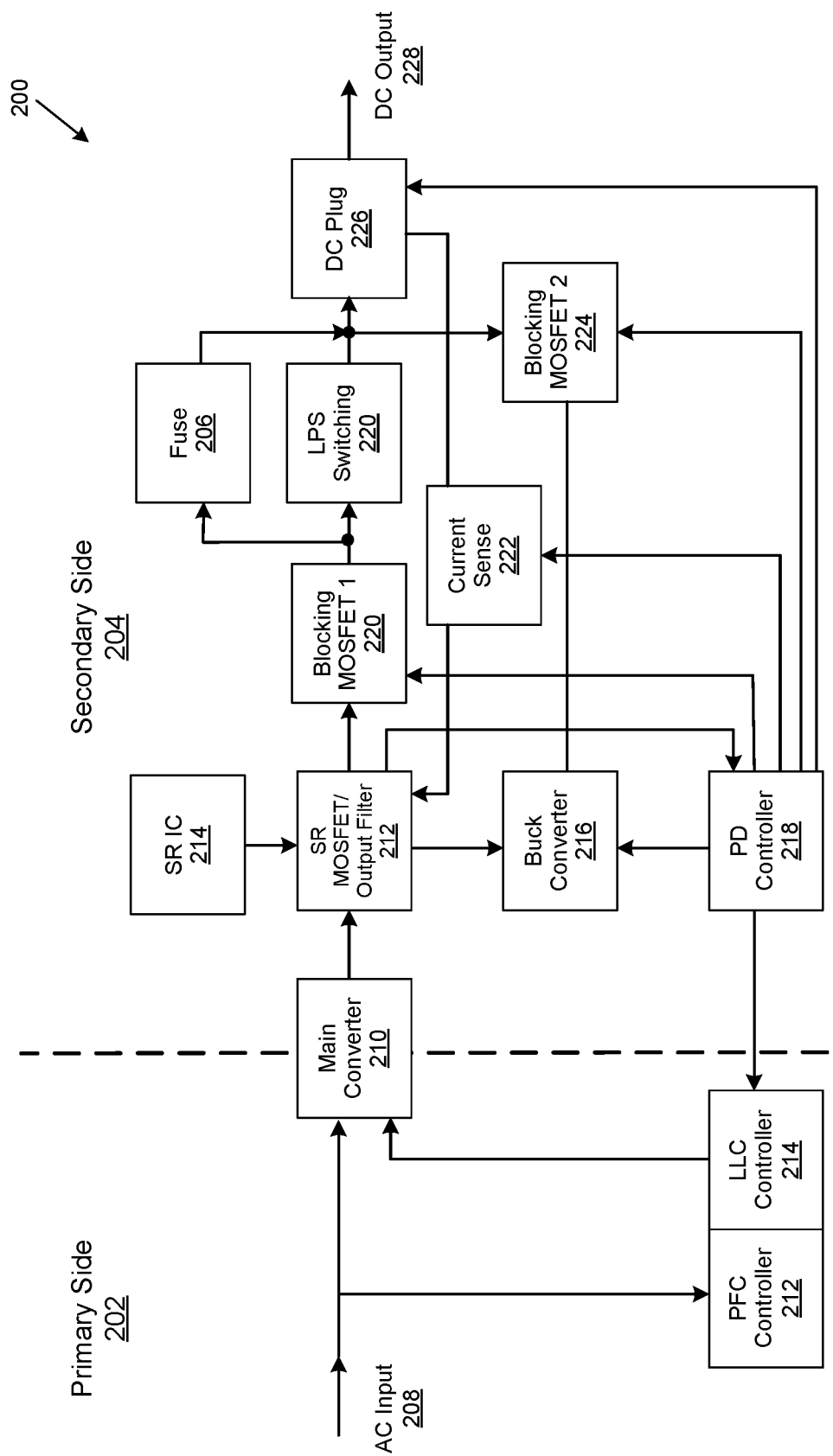
FIG. 2 illustrates a block diagram of a power supply adapter.

FIG. 2 shows a power supply adapter (PSA) 200. Implementations provided for the PSA 200 includes a primary side 202 and a secondary side 204. As described above, a fuse 206 may be used to comply with safety LPS 100VA requirement when a current sense resistor is shorted. The fuse 206 may be a constraint as to adapter peak power capability and as a result cannot support the PSA 200 with large dynamic power/current to meet the LPS 100VA limitation. Therefore, as described herein, the fuse 206 is eliminated in the described implementations, and other circuits and methods are implemented to address PSA compliance testing where the fuse 206 may have previously been used.

The PSA 200 receives an AC input 208, where certain implementations provide for a value of 90-264 VAC input range. The AC input 208 may be processed by various filters and stages, where the processed signal is received by a main converter 210. The main converter 210 may be configured as an LLC converter (two inductors "L" and one capacitor "C"). An AC input 208 signal may be received by a power factor correction or PFC controller 212 configured with an LLC controller 214. The main converter 210 receives the output of the LLC controller 214.

At the secondary side 204, the main converter 210 provides a voltage to a synchronous rectifier (SR) MOSFET, which may include or is configured to an output filter, and collectively referred to as SR MOSFET/output filter 212. Implementations further provide for the SR MOSFET/output filter 212 to receive an input from an SR integrated circuit (IC) 214. Output of the SR MOSFET/output filter 212 are generated gate signals proportional to an output load.

Implementations provide for the SR MOSFET/output filter 212 to provide an output to a buck converter 216 further described herein. The SR MOSFET/output filter 212 provides an output to a power device (PD) controller 218 further described herein. Implementations further provide for a blocking MOSFET 1 220 to receive an output from the SR MOSFET/output filter 212.

As described above, the fuse 206 is eliminated in described implementations. An LPS switching circuit 220 and current sense circuit 222 are also eliminated when the fuse 206 is not used, and the described circuits and methods to address PSA compliance testing are implemented.

Implementations provide for a blocking MOSFET 2 224 as further described herein. A DC plug 226 receives the output voltage of the PSA 200, and provides a DC output 228. Implementations provide for the DC output 228 to be 20V/6.5 A or 5V/1 A.

Figure 3:
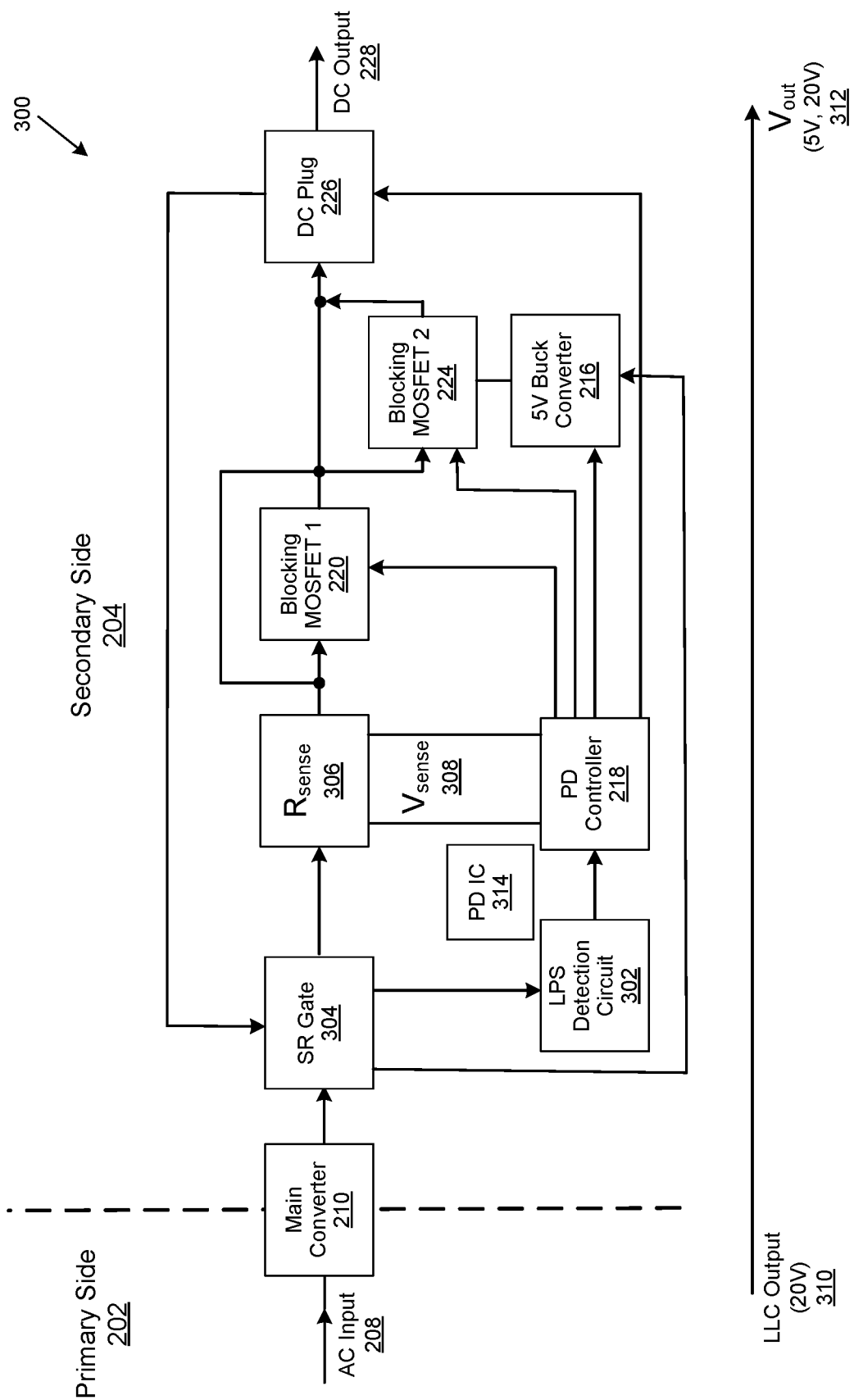
FIG. 3 illustrates a block diagram of a power supply adapter implementing a limited power supply (LPS) detection circuit.

FIG. 3 shows a power supply adapter (PSA) implementing a limited power supply (LPS) detection circuit. Embodiments include PSA 300 to be implemented as 130 W (USB) Type C PSA with two power converters. The first converter is 5V, and second converter is 20V. Both converters may operate at the same time, but can be blocked from output by blocking MOSFET 1 220 and blocking MOSFET 2 224. When output voltage is set at 5V, and a single fault is performed which shorts the 20V blocking MOSFET 1 220, 20V will appear on 5V to an attached PD. This can result in non-compliance to the testing standard and can be a VOC (open circuit voltage) issue that can damage a 5V device.

The PSA 300 implements a similar configuration as the PSA 200; however, introduces a LPS detection circuit 302 and other components as further described herein, and eliminates particular components of the PSA 200, particularly fuse 206.

Implementations provide for the LPS detection circuit 302 to monitor current from a synchronous rectifier (SR) gate 304 which represents SR MOSFET/output filter 212 and SR IC 214 described in FIG. 2. Implementations provide for the PSA 300 to include a sense resistor or $R_{sense}$ 306. An example value of $R_{sense}$ 306 is 10 mOhm. A sense voltage or $V_{sense}$ 308 is calculated across $R_{sense}$ 306. In particular, the PD controller 218 measures current value across $R_{sense}$ 306 to determine $V_{sense}$ 308.

The SR gate 304 signals are a duty cycle control to drive SR MOSFETs of SR MOSFET/output filter 212 at the secondary side 204 of PSA 300. A duty cycle signal can be converted to voltage level tracking output current. As output current is increased, the voltage level increases proportionally. The PD controller 218 compares SR voltage signal to the $V_{sense}$ 308 across $R_{sense}$ 306. The PD controller 218 monitors the SR voltage of SR gate 304 which is compared to a current $V_{sense}$ 308, if the SR signal surpasses the current sense signal the PD controller 314 enters protection mode. In other words. if SR voltage of SR gate 304 is greater than the current $V_{sense}$ 308, it is an indication of shorted $R_{sense}$ 306.

A voltage is received from the primary side as represented by LLC output 310. Implementations provide for LLC output 310 to be at 20V. An output voltage Vout 312 can be 5V or 20V. The PSA 300 is configured to protect a PD during testing when the PD is configured to receive 5V, considering 20V flows from the LLC output 310. Furthermore, the configuration of PSA 300 provides for overcurrent protection, such as when the PD or PD components (e.g., PD processors) require overcurrent that would destroy fuse 206.

Various implementations provide for a PD integrated circuit (IC) 314 to detect a signal of the SR gate 304 to determine whether SR gate 304 output is with loading of $R_{sense}$ 306 or is without loading of $R_{sense}$ 306. Implementations provide that when the PD IC 314 receives a signal of loading, the PD IC 314 can check $V_{sense}$ 308 for short detection of $R_{sense}$ 306.

Implementations provide for the PD IC 314 to determine if $R_{sense}$ 306 is shorted under a single fault condition and determine if output current is less than 100 VA per LPS standard. PD IC 314 can set a threshold point as to load by the system of PSA 300. If a single fault condition exists and the threshold is exceeded, then the PSA 300 can go into latch off mode. The PD IC 314 can send a series of signals to the primary side 202 of the PSA 300 to enter protection operations. The signals of SR gate 304 which are proportional to output load and $R_{sense}$ 306 as monitored by the PD IC 314/PD controller 218 provide for such implementations.

Therefore, output current or $I_{out}$ flows across $R_{sense}$ 306 and translated to $V_{sense}$ 308. $V_{sense}$ 308 following $I_{out}$ to change. When $V_{sense}$ 308 exceeds a loading detection line, the PSA 300 continues in operation. When $V_{sense}$ 308 is lower than the loading detection line, $R_{sense}$ 306 is indicated to be shorted. In order to recognize if there is an output current flow into $R_{sense}$ 306, a detect signal is used. The detect signal can be a virtual general purpose input output (VGPIO) that reflects the signal of the SR gate 304. When loading increases, the VGPIO voltage linearly increases. If the PD IC 314 detects a $V_{sense}$ 308 voltage lower than loading detection and VGPIO voltage higher than the checked $I_{out}$, the PD IC 314 can send a signal to the primary side 202 to shutdown PSA 300. Once the PD IC 314 detects $V_{sense}$ 308 voltage higher than loading detection and VGPIO voltage higher than the checked $I_{out}$, PD IC 314 merely keeps PSA 300 in operation.

Figure 4:
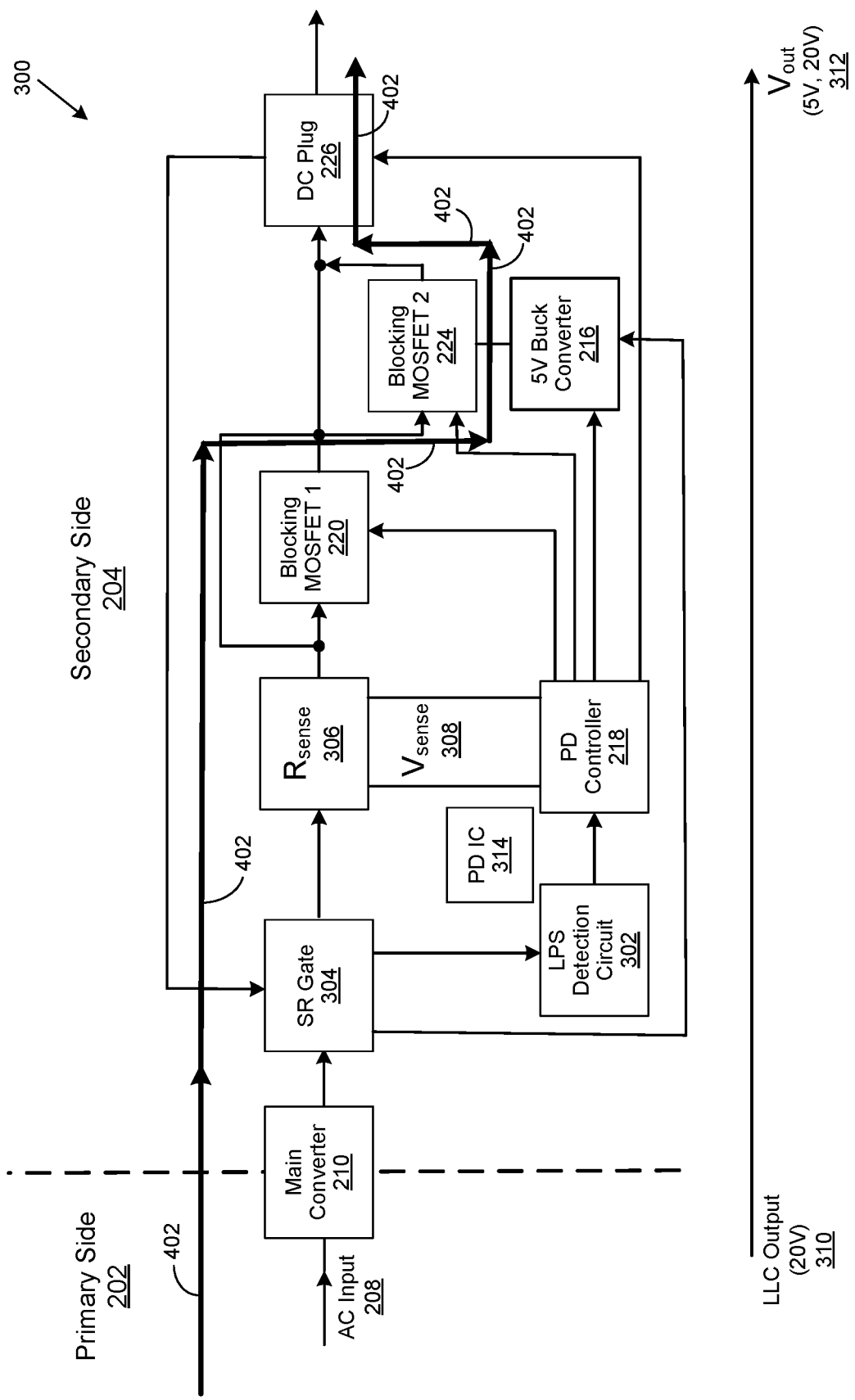
FIG. 4 illustrates a block diagram of a power supply adapter with a shorted blocking MOSFET.

FIG. 4 shows a power supply adapter (PSA) with a shorted blocking MOSFET. In testing, the blocking MOSFET 1 220 may be shorted. A current 402 is shown that flows through the PSA 300 as shown by line 402. The blocking MOSFET 1 220 may be shorted for single fault cases, and the PD output may be 5V. In general, the blocking MOSFET 224 provides for overcurrent protection during instances when the blocking MOSFET 1 220 is shorted, and when the PD is a 5V device and when there are overcurrent requirements by the PD.

Figure 5:
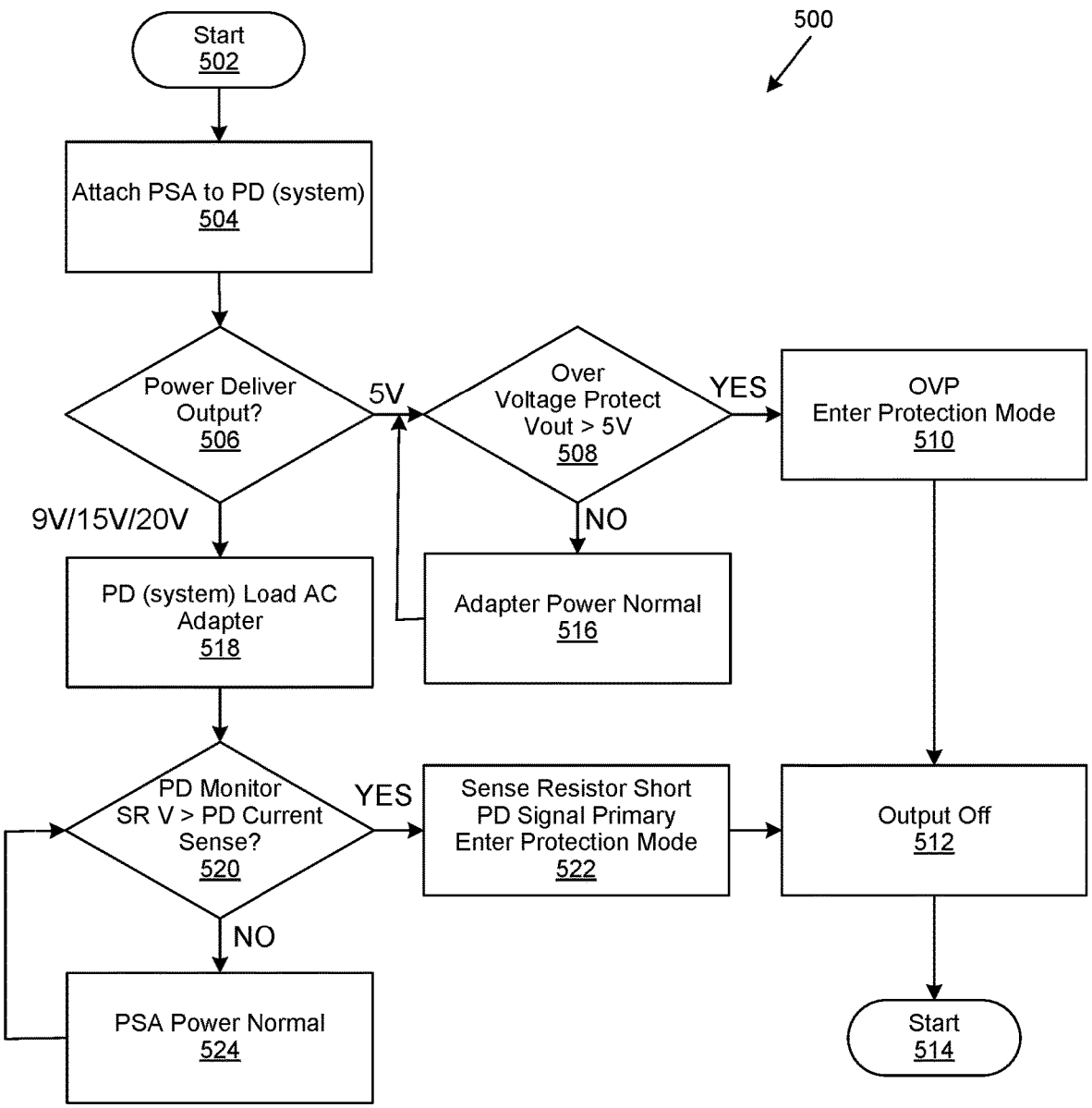
FIG. 5 is a generalized flowchart for normal condition and sense resistor short conditions for a power supply adapter.

FIG. 5 is a generalized flowchart for normal condition and sense resistor short conditions for a power supply adapter. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention. The process 500 may be implemented using the information handling system connected to the PSA 300.

At step 502, the process 500 starts. At step 504, a PSA, such as PSA 300 is attached to a powered device or PD, such as an information handling system 100. Implementations provide for the PSA to be a 130 W (USB) type C PSA with two power converters as described above.

At step 506, a determination is performed as to the power delivery to the PD, such as provided at DC plug 226 and indicated as DC output 226. If the power delivery is 5V, at step 508, a determination is made over voltage protection is to be performed. If $V_{out}$ is greater than 5V, then following the YES branch of step 508, at step 510 over voltage protection is provided and protection mode is entered, and the blocking MOSFET is opened. At step 512 output is turned off. At step 514, the process 500 ends.

If $V_{out}$ is not greater than 5V, then following the NO branch of step 508, at step 516, PSA power remains normal, and step 508 follows.

If the power delivery is 9V/15V/20V, at step 518, the PD/PD system or information handling system 100, loads the PSA, such as PSA 300, and particularly AC input. When monitoring by the PD IC 314/PD controller 218 of the SR gate 304 signals, and specifically voltage (SR V) and a sense current value at $R_{sense}$ 306 (PD Current sense), if SRV is greater than the $V_{sense}$ 308 (PD Current Sense), then following the YES branch of step 520, step 522 is performed. At step 522, an indication is performed that the $R_{sense}$ 306 is shorted, and the PD signals a primary enter protection mode. The system is shut down. At step 512 output is turned off. At step 514, the process 500 ends.

If SRV is not greater than the $V_{sense}$ 308 (PD Current Sense), then following the YES branch of step 520, step 524 is performed. PSA power remains normal. Step 520 is followed.

Figure 6:
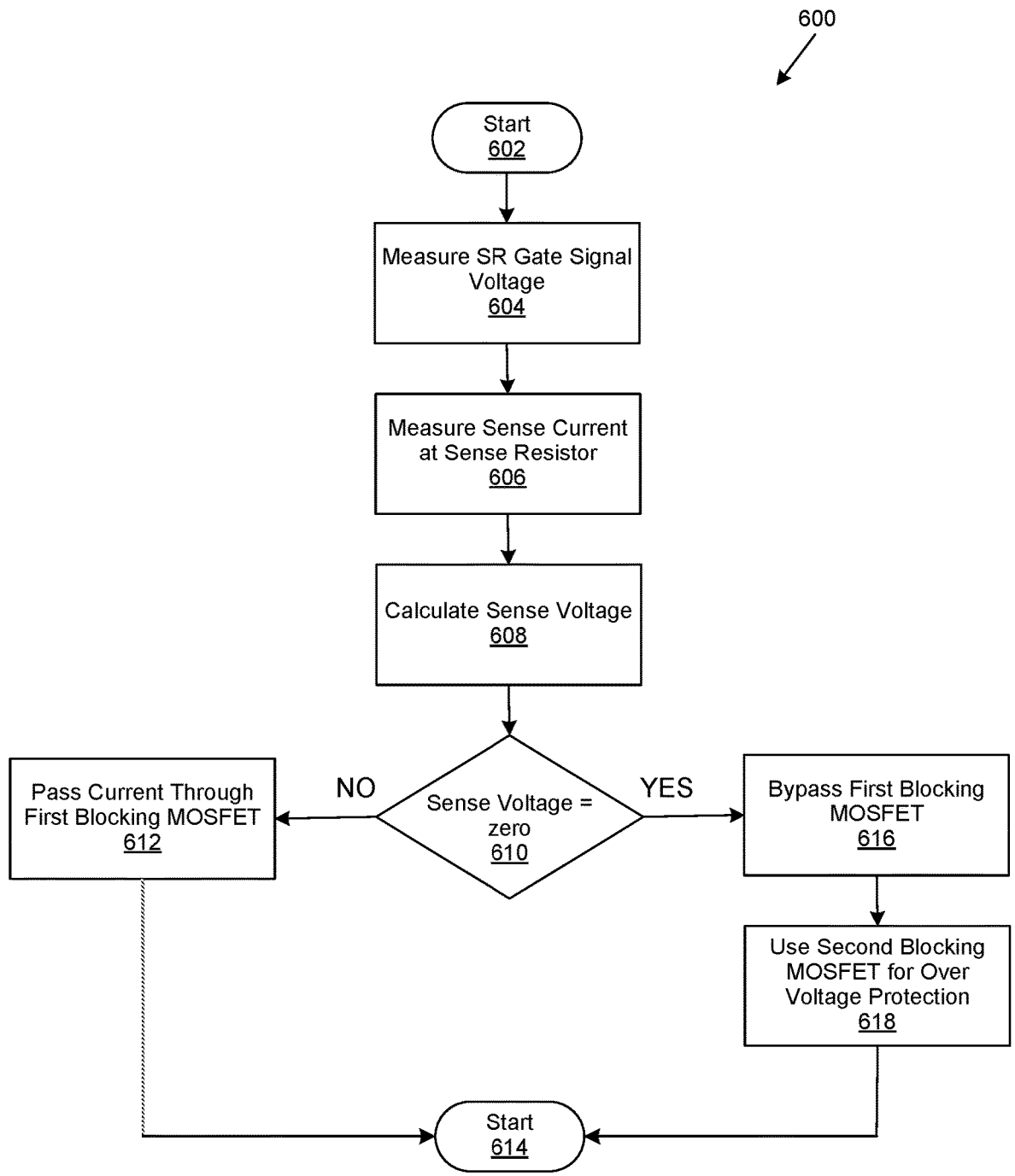
FIG. 6 is a generalized flowchart for compliance testing of a power supply adapter.

FIG. 6 is a generalized flowchart compliance testing of a power supply adapter. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention. The process 600 may be implemented using the information handling system connected to the PSA 300.

At step 602, the process 600 starts. At step 604, SR gate signal voltage is measures, such as a voltage of signals from SR gate 304. At step 606, sense current is measure at a sense resistor, such as $R_{sense}$ 306. At step 608, sense voltage, such as $V_{sense}$ 308 is calculated from values of sense current and sense resistor $R_{sense}$ 306.

If sense voltage is not zero, following the NO branch of step 610, then at step 612, the current received by the PSA is passed through a first blocking MOSFET, such as blocking MOSFET 1 220. At step 614, the process 600 ends.

If sense voltage is zero, an indication of a short exists, and following the YES branch of step 610, then at step 616, current received by the PSA bypasses the first blocking MOSFET, such as blocking MOSFET 1 220. At step 618, a second blocking MOSFET, such as blocking MOSFET 2 224 is used for over voltage protection. At step 614, the process 600 ends.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Embodiments of the invention are described with reference to flowchart illustrations and/or step diagrams of methods, apparatus (systems) and computer program products according to embodiments of the invention. It will be understood that each step of the flowchart illustrations and/or step diagrams, and combinations of steps in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram step or steps.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram step or steps.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A computer-implementable method for compliance testing of a power supply adapter (PSA) to a powered device (PD) comprising:

measuring a voltage at synchronous rectifier (SR) gate of the PSA, where the SR gate receives current from a main converter of the PSA;
   measuring a sense current at a sense resistor wherein the sense current follows from the SR gate;
   calculating a sense voltage based on the measured sense current and value of sense resistor;
   if sense voltage is zero, bypassing received current of the PSA at a first blocking MOSFET, and using a second blocking MOSFET for over voltage protection and passing the received current to an output of the PSA; and
   if the sense voltage is not zero, passing the received current through the first blocking MOSFET.

2. The computer-implementable method of claim 1, wherein a LPS detection circuit monitors the voltage at the SR gate.

3. The computer-implementable method of claim 1, wherein a PD controller performs the measuring of the sense current.

4. The computer-implementable method of claim 1, wherein a PD integrated circuit (IC) detects loading of the sense current, wherein loading condition determines if PSA remains operational.

5. The computer-implementable method of claim 1, wherein a PD integrated circuit (IC) sets a threshold point as to load of the PSA.

6. The computer-implementable method of claim 1, wherein the second blocking MOSFET is configured to a 5V buck converter.

7. The computer-implementable method of claim 1, wherein the PSA is a 130 W (USB) type C PSA with two power converters.

8. A system comprising:
   a processor;
   a data bus coupled to the processor; and
   a non-transitory, computer-readable storage medium embodying computer program code, the non-transitory, computer-readable storage medium being coupled to the data bus, the computer program code interacting with a plurality of computer operations for compliance testing of a power supply adapter (PSA) to a powered device (PD) comprising and comprising instructions executable by the processor and configured for:
   measuring a voltage at synchronous rectifier (SR) gate of the PSA, where the SR gate receives current from a main converter of the PSA;
   measuring a sense current at a sense resistor wherein the sense current follows from the SR gate;
   calculating a sense voltage based on the measured sense current and value of sense resistor;
   if sense voltage is zero, bypassing received current of the PSA at a first blocking MOSFET, and using a second blocking MOSFET for over voltage protection and passing the received current to an output of the PSA; and
   if the sense voltage is not zero, passing the received current through the first blocking MOSFET.

9. The system of claim 8, wherein a LPS detection circuit monitors the voltage at the SR gate.

10. The system of claim 8, wherein a PD controller performs the measuring of the sense current.

11. The system of claim 8, wherein a PD integrated circuit (IC) detects loading of the sense current, wherein loading condition determines if PSA remains operational.

12. The system of claim 8, wherein a PD integrated circuit (IC) sets a threshold point as to load of the PSA.

13. The system of claim 8, wherein the second blocking MOSFET is configured to a 5V buck converter.

14. The system of claim 8, wherein the PSA is a 130 W (USB) type C PSA with two power converters.

15. A power supply adapter (PSA) configured to supply power to a powered device (PD) comprising:
- a synchronous rectifier (SR) gate of the PSA, where the SR gate receives current from a main converter of the PSA, wherein voltage of the SR gate is measured;
- a sense resistor receiving sense current at a sense resistor which follows from the SR gate, wherein a sense voltage is calculated based measure sense current and value of the sense resistor;
- a first blocking MOSFET, wherein if sense voltage is zero, by passing received current of the PSA at the first blocking MOSFET; and
- a second blocking MOSFET for over voltage protection when the first blocking MOSFET is bypassed, and if the sense voltage is not zero, passing the received current through the first blocking MOSFET.

16. The PSA of claim 15 further comprising a LPS detection circuit monitors the voltage at the SR gate.

17. The PSA of claim 15 further comprising a PD controller that performs the measuring of the sense current.

18. The PSA of claim 15 further comprising a PD integrated circuit (IC) detects loading of the sense current, wherein loading condition determines if PSA remains operational.

19. The PSA of claim 15 further comprising a PD integrated circuit (IC) that sets a threshold point as to load of the PSA.

20. The PSA of claim 15, wherein the PSA is a 130 W (USB) type C PSA with two power converters.

* * * * *